US009560779B2

(12) United States Patent
Novysedlak et al.

(10) Patent No.: US 9,560,779 B2
(45) Date of Patent: Jan. 31, 2017

(54) THERMAL STABILIZATION OF TEMPERATURE SENSITIVE COMPONENTS

(71) Applicant: Honeywell International Inc., Morristown, NJ (US)

(72) Inventors: Peter Novysedlak, Spisska Nova Ves (SK); Ondrej Hajek, Vysoke Myto (CZ); Martin Konecny, Troubsko (CZ); Milan Vasicek, Brno (CZ)

(73) Assignee: Honeywell International Inc., Morris Plains, NJ (US)

( * ) Notice: Subject to any disclaimer, the term of this patent is extended or adjusted under 35 U.S.C. 154(b) by 10 days.

(21) Appl. No.: 14/504,948

(22) Filed: Oct. 2, 2014

(65) Prior Publication Data
US 2016/0100494 A1 Apr. 7, 2016

(51) Int. Cl.
*H05K 5/02* (2006.01)
*H05K 1/02* (2006.01)
(Continued)

(52) U.S. Cl.
CPC ........... *H05K 5/0239* (2013.01); *B81B 7/0032* (2013.01); *G01D 11/245* (2013.01); *G01P 1/023* (2013.01);
(Continued)

(58) Field of Classification Search
CPC ....... G01D 11/245; G01D 3/028; G01P 1/023; B81B 7/0032; H05K 3/284; H05K 3/3447; H05K 1/141; H05K 3/3452; H05K 5/0239; H05K 5/0213; H05K 5/0013; H05K 1/0212; H01L 2224/4809
See application file for complete search history.

(56) References Cited

U.S. PATENT DOCUMENTS 6,644,117 B1 * 11/2003 Kueck .................. B81B 7/0077
  73/488
2004/0240191 A1 12/2004 Arnold et al.
(Continued)

FOREIGN PATENT DOCUMENTS

JP   11261254     9/1999
JP   2014055865   3/2014
WO   0127026      4/2001

OTHER PUBLICATIONS

Polymer Wikepedia Defintition, Mar. 2, 2016.*
(Continued)

*Primary Examiner* — Steven T Sawyer
*Assistant Examiner* — Ahmad D Barnes
(74) *Attorney, Agent, or Firm* — Fogg and Powers LLC

(57) ABSTRACT

An enclosure for thermally stabilizing a temperature sensitive component on a circuit board is provided. The enclosure comprises a first cover section configured to be mounted over a portion of a first side of the circuit board where at least one temperature sensitive component is mounted. The first cover section includes a first lid, and at least one sidewall that extends from a perimeter of the first lid. The enclosure also comprises a second cover section configured to be mounted over a portion of a second side of the circuit board opposite from the first cover section. The second cover section includes a second lid, and at least one sidewall that extends from a perimeter of the second lid. The first and second cover sections are configured to releasably connect with the circuit board.

15 Claims, 3 Drawing Sheets

(51) Int. Cl.

| | | |
|---|---|---|
| *H05K 5/00* | (2006.01) | |
| *B81B 7/00* | (2006.01) | |
| *G01P 1/02* | (2006.01) | |
| *G01D 11/24* | (2006.01) | |
| *G01D 3/028* | (2006.01) | |

(52) U.S. Cl.
CPC .......... *H05K 1/0212* (2013.01); *H05K 5/0013* (2013.01); *H05K 5/0213* (2013.01); *G01D 3/028* (2013.01); *H05K 2201/06* (2013.01)

(56) References Cited

U.S. PATENT DOCUMENTS

| | | | |
|---|---|---|---|
| 2006/0072294 | A1 | 4/2006 | Kodimer |
| 2007/0139904 | A1* | 6/2007 | English ................ H05K 9/0032 |
| | | | 361/818 |
| 2008/0224786 | A1* | 9/2008 | Stolpman ................. H03B 5/04 |
| | | | 331/66 |
| 2008/0250859 | A1 | 10/2008 | Nakatani |
| 2013/0321088 | A1 | 12/2013 | Vidoni et al. |

OTHER PUBLICATIONS

Lakdawala et al., "Temperature stabilization of CMOS capacitive accelerometers", Journal of Micromechanics and Microengineering, Jan. 19, 2004, pp. 559-566, Publisher: Institute of Physics Publishing.

European Patent Office, "Extended European Search Report from EP Application No. 15187502.8 mailed Jan. 18, 2016", from Foreign Counterpart of U.S. Appl. No. 14/504,948, Jan. 18, 2016, pp. 1-10, Published in: EP.

Lakdawala et al., "Temperature Control of CMOS Micromachined Sensors", Internatinal Micro Electro Mechanical Systems Conference, Jan. 24, 2002, pp. 324-327, Publisher: IEEE, Published in: New York, NY.

Nordin et al., "On-Chip Hotplate for Temperature Control of CMOS SAW Resonators", Symposium on Design, Test, Integration and Packaging of MEMS/MOEMS, 2008, Apr. 9, 2008, pp. 71-76, Publisher: IEEE.

European Patent Office, "Office Action for EP Patent Application No. 15187502.8 mailed Sep. 15, 2016", from Foreign Counterpart of U.S. Appl. No. 14/504,948, Sep. 15, 2016, pp. 1-5, Published in: EU.

\* cited by examiner

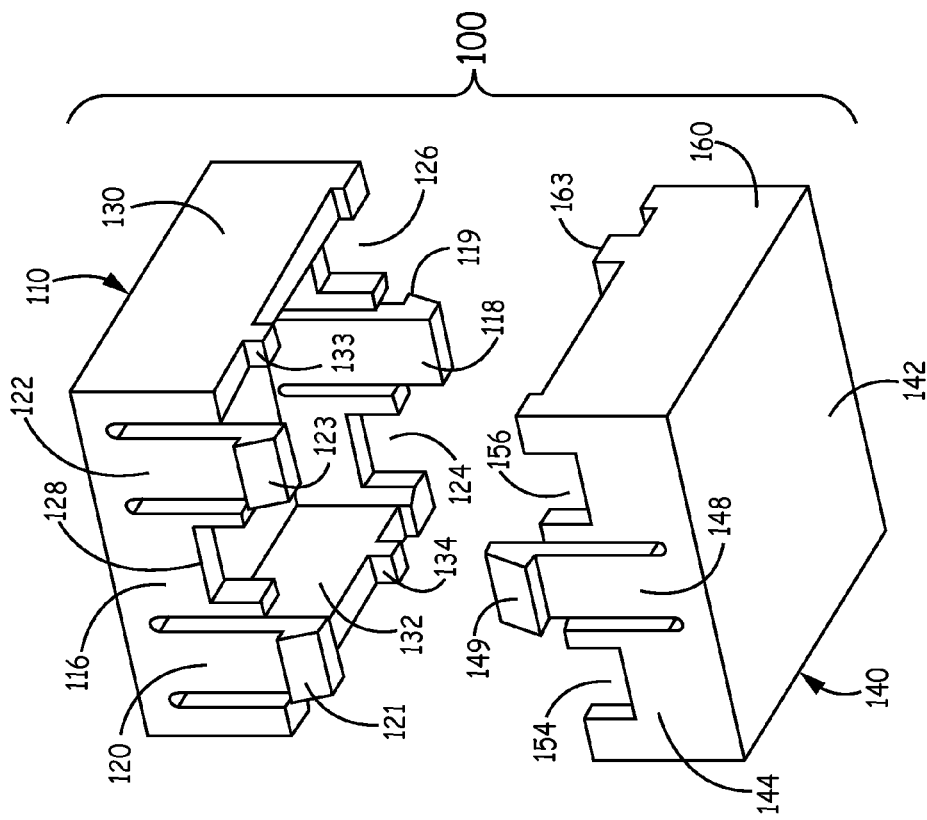
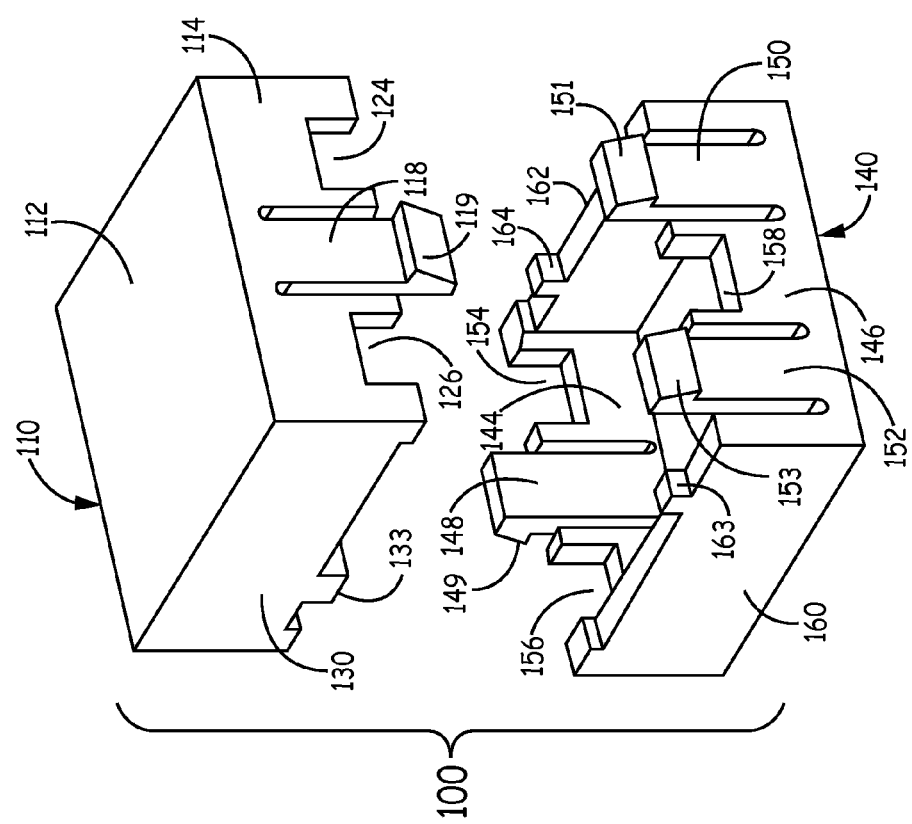

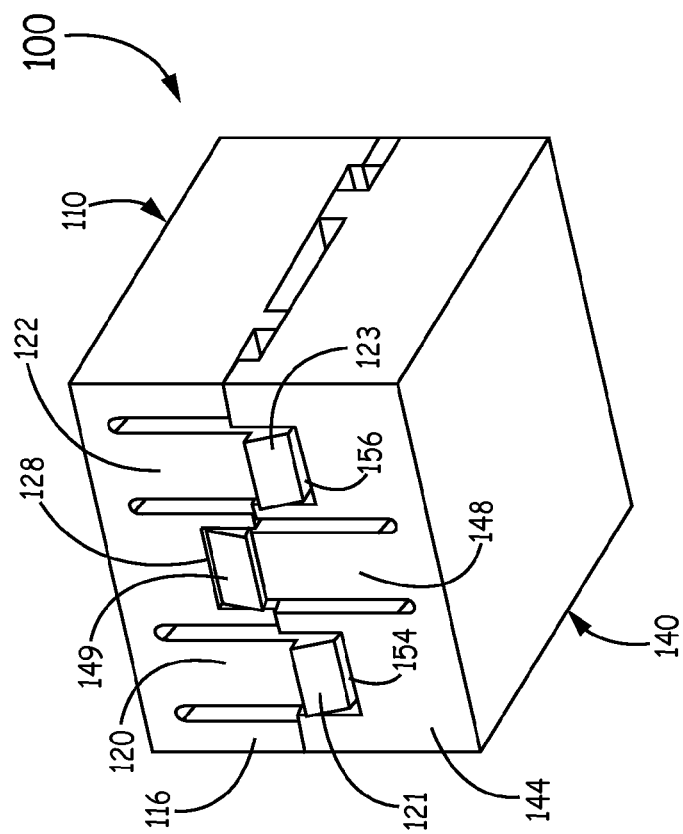
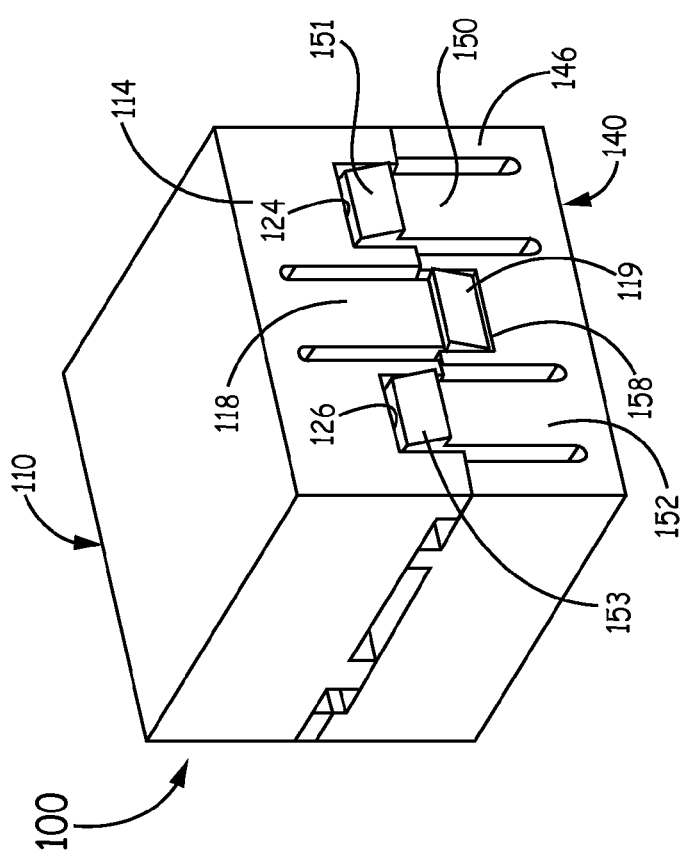
FIG. 2B
FIG. 2A

THERMAL STABILIZATION OF TEMPERATURE SENSITIVE COMPONENTS

BACKGROUND

In various microelectronic applications, temperature stabilization of a device is required to achieve high accuracy. For example, a micro-electrical-mechanical systems (MEMS) sensor such as a MEMS accelerometer is very sensitive to ambient temperature. This is caused by differences in temperature coefficients of expansion (TCE) in each layer of the MEMS accelerometer, and also by the quality of connection between the circuit board and the MEMS accelerometer.

In order to meet high accuracy sensor requirements, temperature drift can be eliminated by keeping the sensor at a constant temperature. One method to achieve this is to heat the sensor to a temperature which is greater than the maximum operating temperature of a product that contains the sensor. Nevertheless, a heated sensor can still be affected by ambient temperature, as maintaining a stable high temperature of the sensor is problematic.

SUMMARY

An enclosure for thermally stabilizing a temperature sensitive component on a circuit board is provided. The enclosure comprises a first cover section configured to be mounted over a portion of a first side of the circuit board where at least one temperature sensitive component is mounted. The first cover section includes a first lid, and at least one sidewall that extends from a perimeter of the first lid. The enclosure also comprises a second cover section configured to be mounted over a portion of a second side of the circuit board opposite from the first cover section. The second cover section includes a second lid, and at least one sidewall that extends from a perimeter of the second lid. The first and second cover sections are configured to releasably connect with the circuit board.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which:

FIGS. 1A and 1B are perspective views of an enclosure for thermally stabilizing a temperature sensitive component according to one embodiment;

FIGS. 2A and 2B are additional perspective views of the enclosure of FIGS. 1A and 1B.

DETAILED DESCRIPTION

Figure 3:
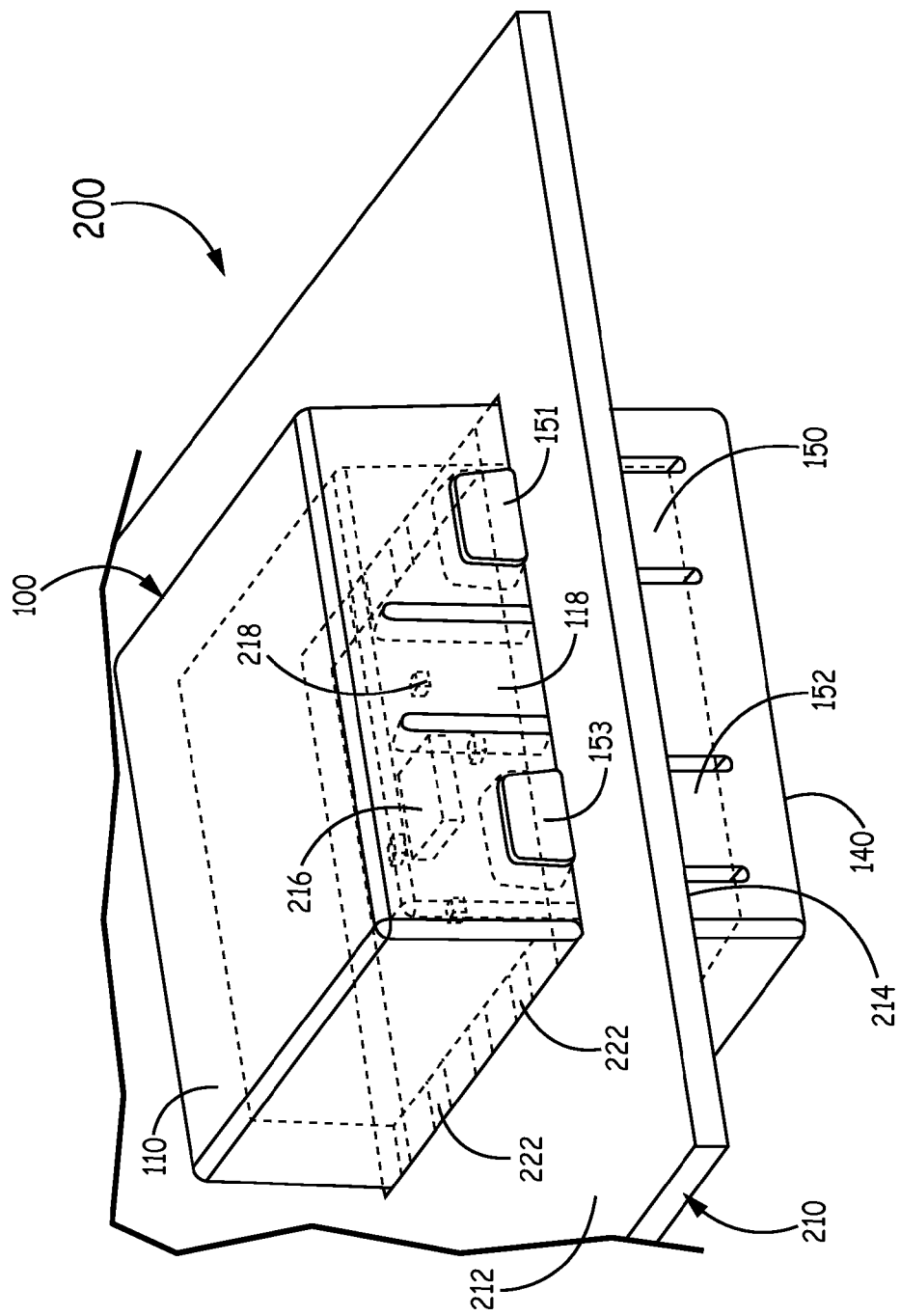
FIG. 3 is a perspective view of an electronic assembly according to one embodiment, which employs an enclosure for thermally stabilizing a temperature sensitive component.

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A system and method for thermal stabilization of temperature sensitive components on a circuit board is provided. Such temperature sensitive components can include, for example, sensors, oscillators, analog-to-digital converters, or other electronic components typically mounted on a circuit board.

In one embodiment, the enclosure comprises an oven, which includes mechanical cover parts that surround the temperature sensitive component and a heater, to isolate the temperature sensitive component from ambient temperature. The oven is configured to maintain a stable high temperature of the temperature sensitive component, while reducing the energy used by the heater. The oven saves on manufacturing costs, as the cost of fabricating the oven and installation time is reduced. The oven is designed to be robust, so it can withstand vibration stress, and the oven weight is minimal. In addition, the oven can be used in various applications where temperature stabilization is needed.

In an exemplary embodiment, the oven can be employed for thermally stabilizing a micro-electrical-mechanical systems (MEMS) sensor. The oven is configured to reduce temperature dependent electrical and mechanical error sources in the MEMS sensor. This results in a higher performance, lower cost MEMS sensor.

The manufacturing cost of parts for the oven can be reduced by using two identical covers that surround a Printed Circuit Board (PCB) from both sides. In one embodiment, installation is achieved with flexible pads on the covers. This allows for no other attachment mechanism such as screws or glue to be necessary to keep the oven parts attached to the PCB. The number of pads is selected as a trade off between manufacturing cost and robustness. Holes or slots on the sidewalls of the oven are provided to avoid incorrect installation. The PCB can be provided with cutouts to accommodate the oven, so no extra circuit board needs to be manufactured.

FIGS. 1A and 1B illustrate an enclosure 100 for thermally stabilizing at least one temperature sensitive component on a printed circuit board, according to one embodiment. The enclosure 100 generally includes a first cover section 110 and a second cover section 140, which are configured to releasably interconnect with a printed circuit board, as described further hereafter with respect to FIG. 3. The first cover section 110 and second cover section 140 include substantially the same structural features. This allows for ease of manufacture and assembly of enclosure 100.

The first cover section 110 includes a lid 112, a first sidewall 114, and a second sidewall 116 opposite from side wall 114. The sidewalls 114 and 116 vertically extend from a perimeter of lid 112. The sidewall 114 includes a first flexible pad 118 that extends in a perpendicular direction away from lid 112. The flexible pad 118 has a tapered flange 119 at a distal end thereof. The sidewall 116 includes a second flexible pad 120 and a third flexible pad 122 that each extend in a perpendicular direction away from lid 112. The flexible pad 120 has a tapered flange 121 at a distal end thereof, and flexible pad 122 has a tapered flange 123 at a distal end thereof. The sidewall 114 includes a first slot 124 and a second slot 126 each respectively located on opposite sides of flexible pad 118. The sidewall 116 includes a third slot 128 located between flexible pads 120 and 122.

The first cover section 110 also includes a third sidewall 130 and a fourth sidewall 132 opposite from sidewall 130. The sidewalls 130 and 132 vertically extend from the perimeter of lid 112 and are each perpendicularly adjoined with sidewalls 114 and 116. The sidewall 130 includes at least one nub 133 that protrudes from an edge of sidewall 130 opposite from lid 112. The sidewall 132 also includes at least one nub 134 that protrudes from an edge of sidewall 132 opposite lid 112.

The second cover section 140 includes a lid 142, a first sidewall 144, and a second sidewall 146 opposite from sidewall 144. The sidewalls 144 and 146 vertically extend from a perimeter of lid 142. The sidewall 144 includes a first flexible pad 148 that extends in a perpendicular direction away from lid 142. The flexible pad 148 has a tapered flange 149 at a distal end thereof. The sidewall 146 includes a second flexible pad 150 and a third flexible pad 152 that each extend in a perpendicular direction away from lid 142. The flexible pad 150 has a tapered flange 151 at a distal end thereof, and flexible pad 152 has a tapered flange 153 at a distal end thereof. The sidewall 144 includes a first slot 154 and a second slot 156 each respectively located on opposite sides of flexible pad 148. The sidewall 146 includes a third slot 158 located between flexible pads 150 and 152.

The second cover section 140 also includes a third sidewall 160 and a fourth sidewall 162 opposite from sidewall 160. The sidewalls 160 and 162 vertically extend from the perimeter of lid 142 and are each perpendicularly adjoined with sidewalls 144 and 146. The sidewall 160 includes at least one nub 163 that protrudes from an edge of sidewall 160 opposite from lid 142. The sidewall 162 also includes at least one nub 164 that protrudes from an edge of sidewall 162 opposite lid 142.

The cover sections 110 and 140 can be composed of light weight plastic materials, such as polycarbonate (e.g., Makrolon). The cover sections can be formed using standard fabrication techniques such as milling, casting, or additive manufacturing (e.g., 3D printing).

FIGS. 2A and 2B illustrate enclosure 100 with first cover section 110 placed over second cover section 140, such that cover sections 110 and 140 are interconnected together as would be done when enclosure 100 is assembled on a printed circuit board. As shown in FIG. 2A, tapered flange 119 of flexible pad 118 is received in slot 158 of sidewall 146. Likewise, tapered flange 151 of flexible pad 150 is received in slot 124 of sidewall 114, and tapered flange 153 of flexible pad 152 is received in slot 126 of sidewall 114. As shown in FIG. 2B, tapered flange 149 of flexible pad 148 is received in slot 128 of sidewall 116. Likewise, tapered flange 121 of flexible pad 120 is received in slot 154 of sidewall 144, and tapered flange 123 of flexible pad 122 is received in slot 156 of sidewall 144.

FIG. 3 illustrates an electronic assembly 200, in which enclosure 100 is employed for thermally stabilizing a temperature sensitive component. The electronic assembly 200 includes a printed circuit board 210 having a first side 212 and an opposing second side 214. The enclosure 100 surrounds a portion of printed circuit board 210 where at least one temperature sensitive component 216, such as a MEMS sensor, is located. The temperature sensitive component 216 is mounted on first side 212 of printed circuit board 210 within cover section 110. One or more additional electronic components 218, such as a heater, can be mounted on first side 212 adjacent to temperature sensitive component 216 and within cover section 110. Alternatively, one or more electronic components such as a heater can be mounted on second side 214 of printed circuit board 210 within cover section 140.

The first cover section 110 is positioned over first side 212 of printed circuit board 210 and defines a cavity for housing temperature sensitive component 216 and electronic components 218 when used. The second cover section 140 is positioned over second side 214 of printed circuit board 210 opposite from cover section 110 and defines a cavity for housing one or more electronic components when employed.

The first and second cover sections 110 and 140 are releasably interlocked with printed circuit board 210 such that enclosure 100 thermally stabilizes temperature sensitive component 216. In this configuration, enclosure 100 functions as an oven that maintains a predetermined temperature range during operation of temperature sensitive component 216 in electronic assembly 200. In one embodiment, a thermal insulation material (e.g., felt) can be placed within enclosure 100 for enhancing thermal stability.

The printed circuit board 210 has multiple cut-outs 222 to accommodate assembly of enclosure 100. The cut-outs 222 are sized to receive the respective nubs and flexible pads of cover sections 110 and 140.

Installation of enclosure 100 can be simply accomplished by laying cover sections 110 and 140 on each side of printed circuit board 210 and gently pushing on each cover sections 110 and 140 so that respective flexible pads are snapped into place. For example, during installation, tapered flange 151 of flexible pad 150 engages with first side 212 of printed circuit board 210 adjacent to sidewall 114 of cover section 110. Likewise, tapered flange 153 of flexible pad 152 also engages with first side 212 of printed circuit board 210 adjacent to sidewall 114. The other tapered flanges of the flexible pads of cover sections 110 and 140 also engage first and second sides 212 and 214 of printed circuit board 210 in a similar fashion. The tapered flanges are configured to hold the flexible pads in place on printed circuit board 210. This allows enclosure 100 to be held in place without using other fasteners or adhesives.

Removal of enclosure 100 can be easily accomplished by pushing on all of the flexible pads of cover section 110 simultaneously and pulling cover section 110 away from printed circuit board 210, then by pushing on all of the flexible pads of cover section 140 simultaneously and pulling cover section 140 away from printed circuit board 210.

It should be understood that the present enclosure is not limited to a rectangular shape such as described previously with reference to the drawings. In other embodiments, the enclosure can be fabricated to have different geometric shapes as needed for a specific implementation. For example, the enclosure can have a cylindrical shape in which each cover section includes a circular sidewall that vertically extends from a circular lid.

EXAMPLE EMBODIMENTS

Example 1 includes an enclosure for thermally stabilizing a temperature sensitive component on a circuit board, the enclosure comprising: a first cover section configured to be mounted over a portion of a first side of the circuit board where at least one temperature sensitive component is mounted, the first cover section including a first lid and at least one sidewall that extends from a perimeter of the first lid; and a second cover section configured to be mounted over a portion of a second side of the circuit board opposite from the first cover section, the second cover section including a second lid and at least one sidewall that extends from a perimeter of the second lid. The first and second cover sections are configured to releasably connect with the circuit board.

Example 2 includes the enclosure of Example 1, wherein the first cover section and the second cover section include substantially the same structural features.

Example 3 includes the enclosure of any of Examples 1-2, wherein the first cover section includes a first sidewall and a second sidewall opposite from the first side wall, the first sidewall including a first flexible pad that extends in a perpendicular direction away from the first lid, the second sidewall including a second flexible pad and a third flexible pad that each extend in a perpendicular direction away from the first lid.

Example 4 includes the enclosure of Example 3, wherein the first sidewall includes a first slot and a second slot each respectively located on opposite sides of the first flexible pad, and the second sidewall includes a third slot located between the second and third flexible pads.

Example 5 includes the enclosure of Example 4, wherein the first flexible pad includes a tapered flange at a distal end thereof, the second flexible pad includes a tapered flange at a distal end thereof, and the third flexible pad includes a tapered flange at a distal end thereof.

Example 6 includes the enclosure of Example 5, wherein the first cover section includes a third sidewall and a fourth sidewall opposite from the third sidewall, the third sidewall including at least one nub that protrudes from an edge of the third sidewall opposite from the first lid, and the fourth sidewall including at least one nub that protrudes from an edge of the fourth sidewall opposite from the first lid.

Example 7 includes the enclosure of any of Examples 1-6, wherein the second cover section includes a first sidewall and a second sidewall opposite from the first side wall, the first sidewall including a first flexible pad that extends in a perpendicular direction away from the second lid, the second sidewall including a second flexible pad and a third flexible pad that each extend in a perpendicular direction away from the second lid.

Example 8 includes the enclosure of Example 7, wherein the first sidewall includes a first slot and a second slot each respectively located on opposite sides of the first flexible pad, and the second sidewall includes a third slot located between the second and third flexible pads.

Example 9 includes the enclosure of Example 8, wherein the first flexible pad includes a tapered flange at a distal end thereof, the second flexible pad includes a tapered flange at a distal end thereof, and the third flexible pad includes a tapered flange at a distal end thereof.

Example 10 includes the enclosure of Example 9, wherein the second cover section includes a third sidewall, and a fourth sidewall opposite from the third sidewall, the third sidewall including at least one nub that protrudes from an edge of the third sidewall opposite from the second lid, and the fourth sidewall including at least one nub that protrudes from an edge of the fourth sidewall opposite from the second lid.

Example 11 includes an electronic assembly, comprising: a printed circuit board having a first side and an opposing second side; at least one temperature sensitive component mounted on the first side of the printed circuit board; and an enclosure coupled to a portion of the printed circuit board where the at least one temperature sensitive component is mounted. The enclosure comprises a first cover section over a portion of the first side of the printed circuit board, the first cover section including a first lid and at least one sidewall that extends from a perimeter of the first lid, the first cover section defining a cavity that contains the at least one temperature sensitive component; and a second cover section over a portion of the second side of the printed circuit board opposite from the first cover section, the second cover section including a second lid and at least one sidewall that extends from a perimeter of the second lid. The first and second cover sections are releasably connected with the printed circuit board, and the enclosure is configured to thermally stabilize the at least one temperature sensitive component.

Example 12 includes the electronic assembly of Example 11, further comprising a heater mounted on the first side or the second side of the printed circuit board and located within the enclosure.

Example 13 includes the electronic assembly of Example 12, wherein the enclosure is configured as an oven that maintains a predetermined temperature range within the enclosure to thermally stabilize the temperature sensitive component.

Example 14 includes the electronic assembly of any of Examples 11-13, wherein the at least one temperature sensitive component comprises a sensor, an oscillator, or an analog-to-digital converter.

Example 15 includes the electronic assembly of Example 14, wherein the sensor comprises a micro-electrical-mechanical systems (MEMS) sensor.

Example 16 includes the electronic assembly of any of Examples 11-15, wherein the first cover section includes at least two sidewalls having a first set of flexible pads that each include tapered flanges that are engaged with the second side of the printed circuit board.

Example 17 includes the electronic assembly of Example 16, wherein the second cover section includes at least two sidewalls having a second set of flexible pads that each include tapered flanges that are engaged with the first side of the printed circuit board.

Example 18 includes the electronic assembly of Example 17, wherein the at least two sidewalls of the first cover section include a first set of slots that receive the tapered flanges of the second set of flexible pads, and the at least two sidewalls of the second cover section include a second set of slots that receive the tapered flanges of the first set of flexible pads.

Example 19 includes the electronic assembly of any of Examples 11-18, wherein the first cover section includes at least two sidewalls having a first set of nubs that protrude into a first set of cut-outs in the printed circuit board, and the second cover section includes at least two sidewalls having a second set of nubs that protrude into a second set of cut-outs in the printed circuit board.

Example 20 includes the electronic assembly of any of Examples 11-19, further comprising a thermal insulation material within the enclosure.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. An enclosure for thermally stabilizing a temperature sensitive component on a circuit board, the enclosure comprising:
   a first cover section configured to be mounted over a portion of a first side of the circuit board where at least one temperature sensitive component is mounted, the first cover section including a first lid, a first sidewall, and a second sidewall opposite from the first sidewall, the first and second sidewalls extending from a perimeter of the first lid, the first sidewall including a first flexible pad that extends in a perpendicular direction away from the first lid, the second sidewall including a second flexible pad and a third flexible pad that each extend in a perpendicular direction away from the first lid, the first sidewall including a first slot and a second slot each respectively located on opposite sides of the first flexible pad, and the second sidewall including a third slot located between the second and third flexible pads; and a second cover section configured to be mounted over a portion of a second side of the circuit board opposite from the first cover section, the second cover section including a second lid and at least one sidewall that extends from a perimeter of the second lid;

wherein the first and second cover sections are configured to releasably connect with the circuit board;

wherein the first and second cover sections include the same structural features such that the first and second cover sections are mountable interchangeably over either the first side or the second side of the circuit board.

2. The enclosure of claim 1, wherein:
the first flexible pad includes a tapered flange at a distal end thereof;
the second flexible pad includes a tapered flange at a distal end thereof; and
the third flexible pad includes a tapered flange at a distal end thereof.

3. The enclosure of claim 2, wherein the first cover section includes a third sidewall and a fourth sidewall opposite from the third sidewall, the third sidewall including at least one nub that protrudes from an edge of the third sidewall opposite from the first lid, and the fourth sidewall including at least one nub that protrudes from an edge of the fourth sidewall opposite from the first lid.

4. The enclosure of claim 1, wherein the second cover section includes a first sidewall and a second sidewall opposite from the first side wall, the first sidewall of the second cover section including a first flexible pad that extends in a perpendicular direction away from the second lid, the second sidewall of the second cover section including a second flexible pad and a third flexible pad that each extend in a perpendicular direction away from the second lid.

5. The enclosure of claim 4, wherein the first sidewall of the second cover section includes a first slot and a second slot each respectively located on opposite sides of the first flexible pad, and the second sidewall of the second cover section includes a third slot located between the second and third flexible pads.

6. The enclosure of claim 5, wherein:
the first flexible pad of the second cover section includes a tapered flange at a distal end thereof;
the second flexible pad of the second cover section includes a tapered flange at a distal end thereof; and
the third flexible pad of the second cover section includes a tapered flange at a distal end thereof.

7. The enclosure of claim 6, wherein the second cover section includes a third sidewall, and a fourth sidewall opposite from the third sidewall, the third sidewall including at least one nub that protrudes from an edge of the third sidewall opposite from the second lid, and the fourth sidewall including at least one nub that protrudes from an edge of the fourth sidewall opposite from the second lid.

8. An electronic assembly, comprising:
a printed circuit board having a first side and an opposing second side;
at least one temperature sensitive component mounted on the first side of the printed circuit board;
an enclosure coupled to a portion of the printed circuit board where the at least one temperature sensitive component is mounted, the enclosure comprising:
a first cover section mounted over a portion of the first side of the printed circuit board, the first cover section including a first lid and at least two sidewalls that extend from a perimeter of the first lid, the first cover section defining a cavity that contains the at least one temperature sensitive component, wherein the at least two sidewalls have a first set of flexible pads that each include tapered flanges that are engaged with the second side of the printed circuit board; and
a second cover section mounted over a portion of the second side of the printed circuit board opposite from the first cover section, the second cover section including a second lid and at least one sidewall that extends from a perimeter of the second lid; and
a heater mounted on the first side or the second side of the printed circuit board and located within the enclosure, the heater separate from the temperature sensitive component;
wherein the first and second cover sections are releasably connected with the printed circuit board, and the enclosure is configured to thermally stabilize the at least one temperature sensitive component;
wherein the first and second cover sections include the same structural features such that the first and second cover sections are mountable interchangeably over either the first side or the second side of the printed circuit board.

9. The electronic assembly of claim 8, wherein the enclosure is configured as an oven that maintains a predetermined temperature range within the enclosure to thermally stabilize the temperature sensitive component.

10. The electronic assembly of claim 8, wherein the at least one temperature sensitive component comprises a sensor, an oscillator, or an analog-to-digital converter.

11. The electronic assembly of claim 10, wherein the sensor comprises a micro-electrical-mechanical systems (MEMS) sensor.

12. The electronic assembly of claim 8, wherein the second cover section includes at least two sidewalls having a second set of flexible pads that each include tapered flanges that are engaged with the first side of the printed circuit board.

13. The electronic assembly of claim 12, wherein the at least two sidewalls of the first cover section include a first set of slots that receive the tapered flanges of the second set of flexible pads, and the at least two sidewalls of the second cover section include a second set of slots that receive the tapered flanges of the first set of flexible pads.

14. The electronic assembly of claim 13, wherein the first cover section includes at least two sidewalls having a first set of nubs that protrude into a first set of cut-outs in the printed circuit board, and the second cover section includes at least two sidewalls having a second set of nubs that protrude into a second set of cut-outs in the printed circuit board.

15. The electronic assembly of claim 8, further comprising a thermal insulation material within the enclosure.

* * * * *